US012591013B2

(12) United States Patent
Verheijen et al.

(10) Patent No.: US 12,591,013 B2
(45) Date of Patent: Mar. 31, 2026

(54) VEHICLE BATTERY MONITORING

(71) Applicant: Webfleet Solutions B.V., Amsterdam (NL)

(72) Inventors: Paul Roeland Verheijen, Amsterdam (NL); Jasper Johannes Anthonius Pauwelussen, Amsterdam (NL); Silviu Stanimir, Amsterdam (NL)

(73) Assignee: Bridgestone Mobility Solutions B.V., Amsterdam (NE)

( * ) Notice: Subject to any disclaimer, the term of this patent is extended or adjusted under 35 U.S.C. 154(b) by 549 days.

(21) Appl. No.: 17/312,117

(22) PCT Filed: Dec. 10, 2019

(86) PCT No.: PCT/EP2019/084523
§ 371 (c)(1),
(2) Date: Jun. 9, 2021

(87) PCT Pub. No.: WO2020/120514
PCT Pub. Date: Jun. 18, 2020

(65) Prior Publication Data
US 2022/0026492 A1     Jan. 27, 2022

(30) Foreign Application Priority Data

Dec. 10, 2018     (GB) ..................................... 1820073

(51) Int. Cl.
*G01R 31/36*          (2020.01)
*G01R 31/00*          (2006.01)
(Continued)

(52) U.S. Cl.
CPC ....... *G01R 31/3647* (2019.01); *G01R 31/007* (2013.01); *G01R 31/367* (2019.01);
(Continued)

(58) Field of Classification Search
CPC .............. G01R 31/3647; G01R 31/007; G01R 31/367; G01R 31/3835; G01R 31/392; H01M 10/48; H01M 2220/20; Y02E 60/10
See application file for complete search history.

(56) References Cited

U.S. PATENT DOCUMENTS

| | | |
|---|---|---|
| 7,218,118 B1 | 5/2007 | Gonring |
| 2007/0069734 A1 | 3/2007 | Bertness |

(Continued)

FOREIGN PATENT DOCUMENTS

| | | |
|---|---|---|
| CN | 203020100 U | 6/2013 |
| CN | 109523758 | 3/2019 |

(Continued)

OTHER PUBLICATIONS

WO-2019017991-A1_translated (Year: 2019).*
(Continued)

*Primary Examiner* — Catherine T. Rastovski
*Assistant Examiner* — Michael J Singletary
(74) *Attorney, Agent, or Firm* — Patterson Intellectual Property Law, PC

(57)                ABSTRACT

Vehicle battery voltage data is received from a telematics control unit (TCU) of a vehicle dining multiple driving cycles, and analysed to determine a state of health (SOH) and state of charge (SOC) of the battery. The TCU also provides data relating to the state of an ignition switch of the vehicle for use in analysing the voltage data. A starting probability factor for the vehicle is determined and monitored. Information about the ability of the battery to start the vehicle is output to the user.

16 Claims, 6 Drawing Sheets

(51) Int. Cl.

| | | |
|---|---|---|
| *G01R 31/367* | (2019.01) | |
| *G01R 31/3835* | (2019.01) | |
| *G01R 31/392* | (2019.01) | |
| *H01M 10/48* | (2006.01) | |

(52) U.S. Cl.

CPC ....... *G01R 31/3835* (2019.01); *G01R 31/392* (2019.01); *H01M 10/48* (2013.01); *H01M 2220/20* (2013.01)

(56) References Cited

U.S. PATENT DOCUMENTS

| | | | |
|---|---|---|---|
| 2007/0216407 A1 | 9/2007 | Yamaguchi | |
| 2008/0268896 A1 | 10/2008 | Langlois et al. | |
| 2009/0027056 A1* | 1/2009 | Huang | G01R 31/392 320/132 |
| 2009/0146664 A1 | 6/2009 | Zhang | |
| 2009/0265125 A1 | 10/2009 | Zhang | |
| 2010/0026306 A1* | 2/2010 | Zhang | G01R 31/3647 324/426 |
| 2011/0082621 A1* | 4/2011 | Berkobin | B60L 58/16 701/31.4 |
| 2014/0214311 A1 | 7/2014 | Stevens et al. | |
| 2017/0016962 A1 | 1/2017 | Iwane et al. | |
| 2018/0065636 A1* | 3/2018 | Fabregas | B60W 30/18018 |
| 2018/0236890 A1* | 8/2018 | Cyrne | B60L 3/12 |
| 2019/0033396 A1* | 1/2019 | Karner | G01W 1/00 |
| 2019/0385385 A1* | 12/2019 | Davidson | G07C 5/0808 |
| 2019/0385386 A1 | 12/2019 | Davidson | |
| 2020/0164763 A1* | 5/2020 | Holme | B60L 58/16 |
| 2021/0255247 A1 | 8/2021 | Alleva et al. | |

FOREIGN PATENT DOCUMENTS

| | | | | |
|---|---|---|---|---|
| EP | 2404792 A1 | 9/2010 | | |
| GB | 2557073 A | 6/2018 | | |
| WO | 0004620 A2 | 1/2000 | | |
| WO | 2016022659 A1 | 2/2016 | | |
| WO | WO-2019017991 A1 * | 1/2019 | ............... | B60L 3/12 |

OTHER PUBLICATIONS

International Search Authority: European Search Report for corresponding European Application No. EP 21 17 8888 dated Sep. 30, 2021.

Intellectual Property Office: Search Report for corresponding GB Application No. 1820073.3 dated May 31, 2019, 4 pages.

International Search Authority: European Patent Office Search Report for corresponding International Application No. PCT/EP2019/084523, dated Mar. 9, 2020, 5 pages.

International Bureau of WIPO: International Preliminary Report of Patentability for corresponding application PCT/2019/0824523, dated Jun. 8, 2021, 12 pages.

Thomas, Pete, et al: "Identifying the causes of road crashes in Europe", 57th AAAM Annual Conference, Annals of Advances in Automotive Medicine (Sep. 22-25, 20213), 10 pages.

Grube, Ryan J .: "Automotive Battery State-of-Health Monitoring Methods," (2008) Wright State University CORE Scholar (Theses and Dissertations) , 117 pages.

Rune, Prytz: "Machine learning methods for vehicle predictive maintenance using off-board and on-board data," Halmstad University Dissertations No. 9, 96 pages.

Buller, Stephan, et al.: "Impedance-based non-linear dynamic battery modeling for automotive applications," Journal of Power Sources (2003), pp. 422-430, 10 pages.

Karden, Eckhard, et al.: Electrochemical modelling of lead/acid batteries under operating conditions of electric vehicles, Journal of Power Sources (1997), pp. 175-180, 6 pages.

Ruetschi, Paul: "Aging mechanisms and service life of lead-acid batteries," Journal of Power Sources (2004) 33-44, 12 pages.

Coleman, M., et al.: "A Combined SOC Estimation Method Under Varied Ambient Temperature for a Lead-Acid Battery," Power Electroics Research Centre,National University of Ireland, Galway, Ireland, 7 pages.

Meissner, Eberhard, et al.: "Vehicle electric power systems are under change! Implications for deign, monitoring and management of automotive batteries," Journal of Power Sources 95 (2001), 13-23, 11 pages.

Suozzo, Christopher (2008). Lead-Acid Battery Aging and State of Health Diagnosis (Thesis) The Ohio State University, 142 pages.

Omar, Noshin, et al.: "Peukert Revisisted-Critical Appraisal and Need for Modification for Lithium-Ion Batteries," Energies (2013) 6, 5625-5641; doi:10.3390/en6115625 ISSN 1996-1073, www.mdpi.com/journal/energies, 17 pages.

Roberts, Anrew, et al.: Internal combustion engine cold-start efficiency: A review of the problem,causes and potential solutions, Energy Conversion and Management 82 (2014) 327-350, 24 pages.

International Search Authority: European Search Report for corresponding European Patent Application No. EP20275105 dated Dec. 11, 2020, 11 pages.

* cited by examiner

Voltage vs. measurements (40ms resolution)

Time

-23-05-2016 8.28

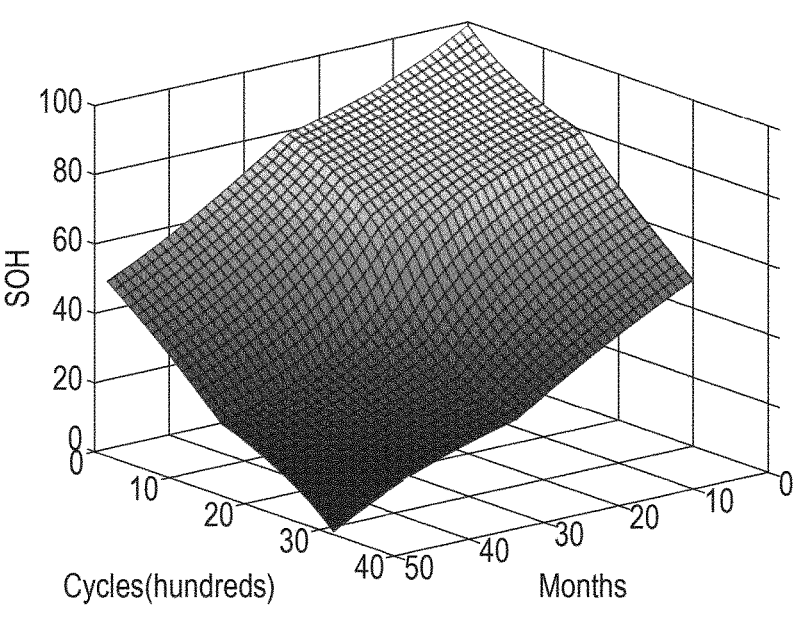
Fig. 5
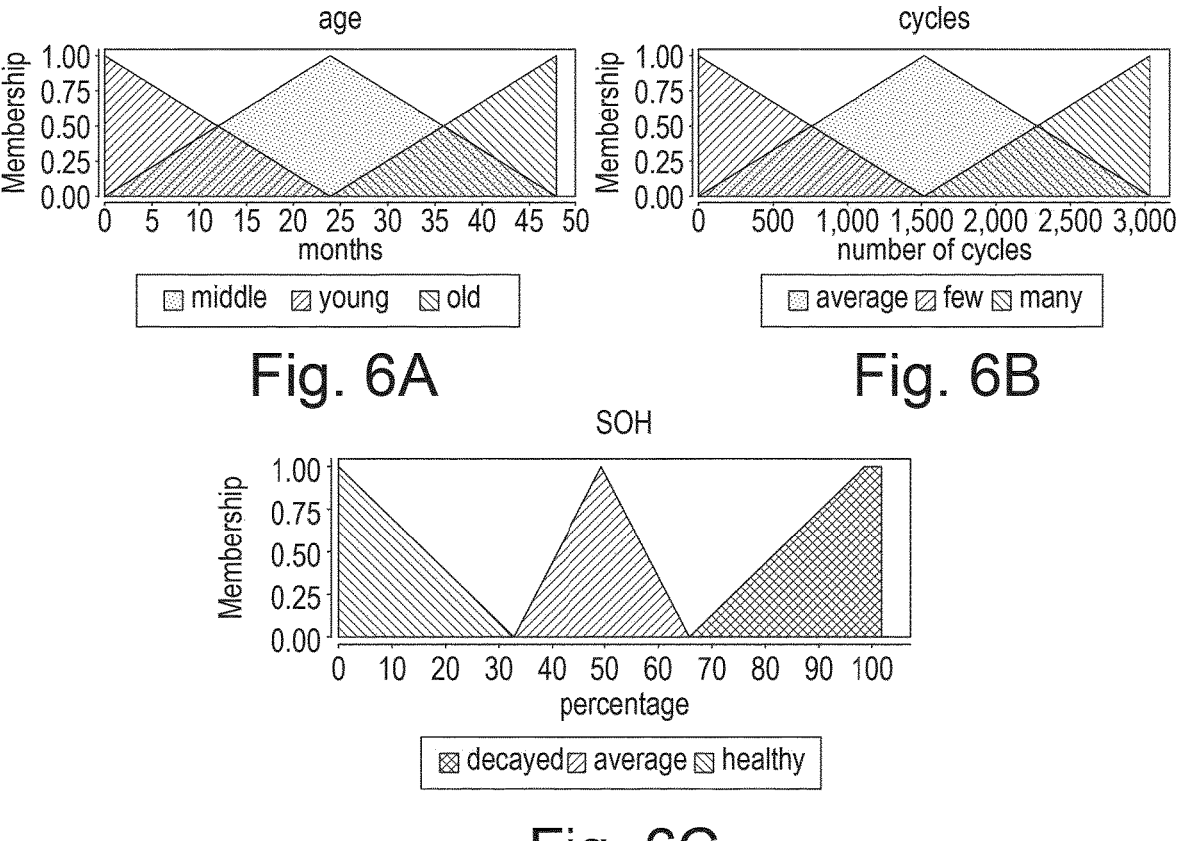
Fig. 6A          Fig. 6B
Fig. 6C

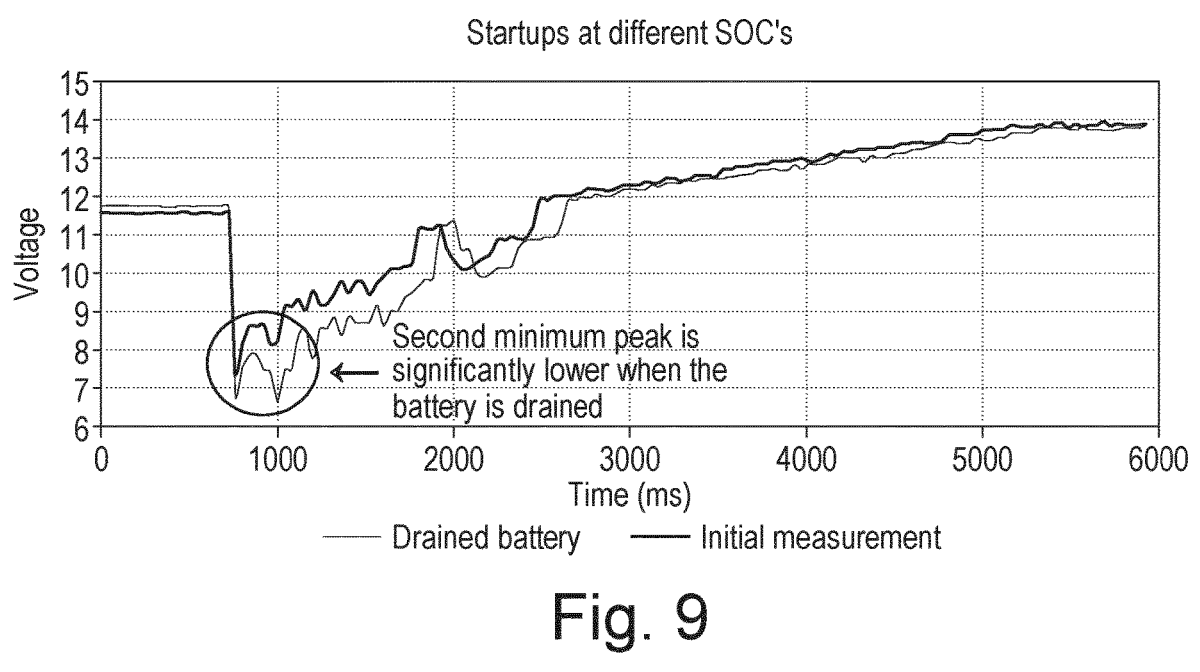

Startups at different SOC's

Second minimum peak is
← significantly lower when the
battery is drained

Time (ms)

——— Drained battery          ——— Initial measurement

Fig. 9

VEHICLE BATTERY MONITORING

FIELD OF THE INVENTION

The present invention relates to methods of assessing the state of the battery of a vehicle. In particular, the invention is directed to methods of obtaining information in relation to the state of a vehicle battery for provision to a user.

BACKGROUND OF THE INVENTION

Vehicles having an internal combustion engine (ICE) include a battery, which is used to provide power for cranking the engine upon start up. Any issue with the battery may result in the electromotor of the vehicle being unable to start-up the ICE, particularly in colder conditions. Vehicle battery problems are frequently cited as one of the top reasons for vehicle downtime. There are various possible causes of vehicle battery malfunction, including, but not limited to, manufacturing defects, physical damage, electrical loads, and a faulty alternator. Vehicle batteries are also used to provide power to various electrical components on-board the vehicle. The number of electrical components embedded in modern vehicles continues to increase, placing increased demands on the vehicle battery.

Techniques have previously been proposed to check the state of health of a vehicle battery. For example, ANWB (the Dutch Automobile Association) offers a service for battery check-up, including a visual inspection of the terminal connections, and a charging test from the alternator. This test takes around 15 minutes, and involves the use of a handheld device, which is used to take different measurements from the battery. The device includes two crocodile clamps which are connected to the respective battery terminals to measure voltage, and a DC ampclamp which is connected around the main battery wiring to measure current. The mechanic will enter information about the battery into the device e.g. battery type, age, rated capacity, and any known previous issues with the battery, and will also input details of the last driving cycle. An infrared temperature sensor is used to take a temperature reading for the battery. This is done by pointing the sensor at the battery. The temperature readings obtained in this way are typically inaccurate, as there may be significant variation e.g. greater than 5 degrees Celsius depending upon the area of the battery to which the sensor is pointed. This variation may arise as a result of the non-uniform structure of the battery, and its uneven thermal isolation. After the device has been connected to the battery, and the information input, a loading test is performed with the engine turned off, to provide a current capacity rating for the battery. A second part of the test is involves the engine cranking and battery charging systems.

The Applicant has recognised that existing techniques, such as the ANWB test described above, have certain limitations. In particular, the need to provide physical connection between a test device and the battery limits the utility of such test methods. In practice, the test will only be performed infrequently, when a driver specifically takes the vehicle to a test location. Such a test is not suited to providing the driver with advanced warning of potential battery issues, and must be performed by a mechanic.

The Applicant has realised that there is a need for improved methods for obtaining information about the state of a vehicle battery for provision to a user.

SUMMARY OF THE INVENTION

In accordance with a first aspect of the invention there is provided a method of obtaining information in relation to the state of a vehicle battery for provision to a user, wherein the battery is used to power cranking of an engine of the vehicle, the method comprising:

obtaining data indicative of the voltage of the battery at a plurality of different times during each one of a plurality of driving cycles of the vehicle;

obtaining data indicative of the timing of the plurality of each one of the driving cycles of the vehicle;

obtaining a set of one or more driving cycle related parameters using at least some of the data indicative of the timing of the plurality of driving cycles of the vehicle;

obtaining a set of one or more voltage related parameters using at least some of the data indicative of the voltage of the battery at a plurality of different times during each one of the driving cycles;

determining, for one or more times, a starting probability factor for the battery indicative of the likelihood that the battery will be capable of starting the engine of the vehicle at the applicable time, wherein the starting probability factor is determined using at least some of the obtained set of driving cycle related parameters and at least some of the set of one or more obtained voltage parameters;

and using the starting probability factor or factors determined for at least some of the one or more times to generate information based on the starting probability factor of the battery for the applicable time for output to a user.

The present invention extends to a system for carrying out a method in accordance with any of the embodiments of the invention described herein.

In accordance with a second aspect of the invention there is provided a system of obtaining information in relation to the state of a vehicle battery for provision to a user, wherein the battery is used to power cranking of an engine of the vehicle, the system comprising:

means for obtaining data indicative of the voltage of the battery at a plurality of different times during each one of a plurality of driving cycles of the vehicle;

means for obtaining data indicative of the timing of the plurality of each one of the driving cycles of the vehicle;

means for obtaining a set of one or more driving cycle related parameters using at least some of the data indicative of the timing of the plurality of driving cycles of the vehicle;

means for obtaining a set of one or more voltage related parameters using at least some of the data indicative of the voltage of the battery at a plurality of different times during each one of the driving cycles;

means for determining, for one or more times, a starting probability factor for the battery indicative of the likelihood that the battery will be capable of starting the engine of the vehicle at the applicable time, wherein the starting probability factor is determined using at least some of the obtained set of driving cycle related parameters and at least some of the set of one or more obtained voltage parameters;

and means for using the starting probability factor or factors determined for at least some of the one or more times to generate information based on the starting probability factor of the battery for the applicable time for output to a user.

It will be appreciated that any feature described by reference to the first aspect of the invention may equally be applied to embodiments in accordance with the second aspect of the invention and vice versa.

The present invention in these further aspects may include any or all of the features described in relation to the first and second aspects of the invention, and vice versa, to the extent that they are not mutually inconsistent. Thus, if not explicitly stated herein, the system of the present invention may comprise means for carrying out any of the steps of the method described.

The means for carrying out any of the steps of the method may comprise a set of one or more processors configured, e.g. programmed, for doing so. A given step may be carried out using the same or a different set of processors to any other step. Any given step may be carried out using a combination of sets of processors. The system may further comprise data storage means, such as computer memory, for storing, for example, voltage data, voltage or driving cycle parameters, starting probability factors determined, weather data etc. In some preferred embodiments, the system is a server.

The methods and systems in accordance with the invention thus involve determining a starting probability factor indicative of the likelihood that the vehicle battery will be able to start the engine of the vehicle at a given time. This enables useful information to be generated based on the determined probability for output to a user. The starting probability factor may be determined automatically based on obtained data. In preferred embodiments at least, the methods of the invention may be performed remotely from the vehicle e.g. by a server. The starting probability may be determined in real-time, and/or may be monitored e.g. on a continual basis. In this way, in embodiments at least, the user may, at any time, obtain information based on the starting probability factor.

The vehicle battery may be any battery which is used to power cranking i.e. start-up of an engine of the vehicle i.e. an internal combustion engine (ICE) of the vehicle. It is envisaged that the invention may be applicable to conventional vehicles having an ICE or hybrid vehicles. The vehicle battery may also be used to power other components of the vehicle, such as electrical accessories e.g. anti-theft devices, seat heaters, air-conditioning, entertainment systems etc. The method is a computer implemented method. It will be appreciated that all of the steps of the methods described herein up to and including determining the starting probability factor for the battery may be performed automatically. The step of generating information based on the starting probability factor(s) for output to the user is also performed automatically, but may or may not be automatically triggered. This step may be performed in response to a request by a user, or may be triggered automatically when one or more conditions are met e.g. at a particular time interval, or upon the user initiating an ignition on state of the vehicle. In other embodiments, it is envisaged that the step of determining the starting probability factor may similarly be performed in response to a request by a user. In such embodiments, the system may then determine the starting probability and the information to be provided by the user. However, it is preferable that the starting probability factor is continually monitored.

It has been found that at least some of the data for use in performing the methods of the present invention may advantageously be obtained from a Telematics Control Unit (TCU) associated with the vehicle. While the primary purpose of a TCU has been to retrieve various controller area network (CAN) messages, e.g. odometer or error messages, it has been recognised that the application of the TCU may readily be extended through the algorithms described herein, without the need to provide additional hardware, simply with an additional payload to the data communication.

A vehicle telematics control unit may be arranged to read data carried over a digital vehicle communications network. Digital communications networks are widely employed in vehicles. The communications protocols used on these in-vehicle networks varies based on the type of vehicle. One commonly used protocol used in automobiles is CAN (Controller Area Network). In-vehicle networks using this protocol are commonly referred to as CAN buses. The digital communication network may be used to transfer data, typically in the form of messages, to control the functionality of numerous systems of the vehicle, including, but not limited to, for example, the engine, brake, door, entertainment and climate systems. For example, data may be transferred between engine control units associated with different systems or subsystems. Various types of data may be transferred over the network as necessary to allow appropriate operation of the vehicle and its systems. Examples of data which may be transferred include, but are not limited to, sensor data, diagnostic state data, operating parameters, control signals etc. Such data may be transferred from one system or subsystem to another over the network.

Telematics control units may be used to read data, e.g. messages, carried over a digital vehicle (communications) network. Such data may be used by telematics control units (TCUs) in a wide range of applications such as, but not limited to, vehicle diagnostics, fuel management, fleet management, infotainment provision, and the implementation of insurance "black box" systems or pay as you drive systems. Applications utilising digital vehicle network data are ever increasing, with more connected car products being released on the market seeking to provide added value and functionality to, for example, the vehicle user, manufacturer or manager. The TomTom® LINK devices are examples of (fixed-install) telematics control units which may be connected to a vehicle in a manner such that they are able to read data transmitted on the digital vehicle network. Such devices are able to track the movements of the vehicle and may perform additional functions such as, but not limited to, monitoring driver behaviour, monitoring fuel consumption or engine emissions, and performing engine diagnostics. The integration of the device with the digital vehicle network enables the device to provide numerous functions using the sensed data, of which the above possibilities are merely exemplary. It has been found that such a device may readily be used in the implementation of the present invention.

The method of the invention comprises the step of obtaining data indicative of the timing of a plurality of driving cycles of the vehicle, and data indicative of the voltage of the battery at a plurality of different times during each one of the plurality of driving cycles of the vehicle. These steps may be performed in any order. However, typically the voltage data is used in obtaining the timing data.

A driving cycle as used herein is defined between initiation of engine cranking i.e. start-up, and stopping of the vehicle with the ignition off. This may correspond to a period between initiation of an engine cranking mode of the vehicle and the next transition from an ignition on to an ignition off state of the vehicle. The duration of a driving cycle as used herein refers to the time interval between the initiation of engine cranking e.g. initiation of an engine cranking mode and stopping of the vehicle with the ignition off i.e. the next transition from an ignition on to an ignition off state.

A vehicle may transition between different modes corresponding to states of an ignition switch of the vehicle. In an ignition off mode of the vehicle, the battery will supply energy at most to any anti-theft and other low power consumption specific loads. The ignition off mode of the vehicle corresponds to a mode of the vehicle when the ignition is in an off state i.e. when an ignition switch is off e.g. a key is not present in the ignition switch. The initiation of engine cranking may correspond to the start of a cranking mode of the vehicle. The cranking mode of the vehicle corresponds to the period during which engine start-up/cranking occurs. The vehicle may also have an accessories activated mode and a drive mode. The transition between various modes of the vehicle may be defined by the state e.g. position of an ignition switch e.g. key.

Broadly, the vehicle may be considered to have ignition on and ignition off states. The accessories activated mode, cranking mode and drive mode are modes within the ignition on state of the vehicle. The ignition off state of the vehicle corresponds to the ignition off mode of the vehicle. The start of the cranking mode of the vehicle may be defined by the transition e.g. moving of an ignition switch to a cranking state e.g. position. The switch may be in the cranking state e.g. position during cranking i.e. start-up of the engine. The vehicle may include an ignition switch e.g. key which is transitionable e.g. movable between at least ignition off, accessories activated and cranking states e.g. positions. In the ignition off state e.g. position the steering wheel is locked. The switch will be in the ignition off state e.g. position in the ignition off state or mode of the vehicle. In this position, where an ignition key is used, the key may be removed from the ignition switch. In the accessories activated state e.g. position, electrical accessory components in the vehicle are operable e.g. air conditioning, seat heating, radio etc. The switch will be in the accessories activated state e.g. position when in the vehicle is in an accessories activated mode. The ignition switch may also be movable to a drive state e.g. position, which is the state e.g. position to which the switch defaults during running of the engine. The switch will be in the drive state e.g. position in the drive mode of the vehicle.

A driving cycle may include an instance of the cranking mode of the vehicle and an instance of a drive mode of the vehicle. The start of the driving cycle may correspond to a transition between an accessories activated mode of the vehicle and a cranking mode, and the end of the driving cycle may correspond to a transition between a drive mode and an ignition off mode of the vehicle.

The method comprises obtaining data indicative of the voltage of the battery at one or more, and preferably a plurality of times, during each of the plurality of driving cycles. The method preferably additionally comprises obtaining data indicative of the voltage of the vehicle battery between driving cycles. In embodiments, the obtained data comprises data resulting from the monitoring the voltage of the battery, during, and in embodiments, between driving cycles. The data may comprise data resulting from the sampling of the battery voltage at different times during each driving cycle, and, in embodiments, between driving cycles. The monitoring may be performed by a TCU of the vehicle. A TCU may obtain voltage measurements through a connection to a power wire of the vehicle, optionally via the CAN bus. In embodiments, the voltage is sampled at different rates (e.g. by the TCU) depending upon a detected ignition state of the vehicle. The initiation of an ignition state may be detected by the TCU of the vehicle Optionally, the voltage may be sampled at differing rates based on a detected mode of the vehicle i.e. within an ignition state of the vehicle. Thus, in embodiments, the method may further comprise obtaining data indicative of the voltage of the battery at different sampling rates depending upon a detected ignition state of the vehicle. This may be determined e.g. based upon a transition in the state of an ignition switch and/or taking into account the measured voltage. For example, in embodiments, the TCU is able to determine whether the vehicle is in an ignition on or ignition off state. This may be achieved using a simple three wire connection of the TCU e.g. to power, ground and ignition wires of the vehicle. This may provide sufficient information to implement embodiments of the invention, enabling a transition between an ignition off state to an ignition on state of the vehicle to be detected. A TCU is typically arranged to detect such transitions between ignition on and off states of the vehicle, as this is may be used to determine the start and end of trips for use in conventional functions performed by a TCU. Thus, the present invention may utilise this existing functionality of a TCU. In more complex arrangements, it is envisaged that the TCU may be arranged to detect an ignition state of the vehicle by reference to a state of the ignition switch. This may enable the TCU to directly detect transitions between accessories on, cranking and drive modes of the vehicle. Thus, in embodiments, the method may comprise detecting a mode of the vehicle by reference to a transition between states of an ignition switch of the vehicle.

The voltage may be sampled at a first (i.e. non-zero) rate when the vehicle is in an ignition off state, and at a second, higher rate, in an ignition on state of the vehicle. In embodiments, the detection of a transition from an ignition off state to an ignition on state of the vehicle triggers an increase in the sampling rate of the voltage e.g. from the first rate to the second, higher rate. The higher sampling rate upon transition to the ignition on state may ensure that relevant voltage data is detected e.g. in relation to the cranking mode when this occurs, given the short duration of the cranking mode, and/or the subsequent driving mode, to provide information for use in the methods described herein.

In embodiments, the method may comprise determining the ignition on or off state of the vehicle based upon a transition in the state of an ignition switch of the vehicle. In embodiments, in addition or alternatively, the method may comprise determining the ignition on or off state of the vehicle using a telematics control unit (TCU) of the vehicle.

The sampling rate is, in embodiments, adjusted automatically upon detection of a transition between ignition off and ignition on states of the vehicle. For example, a TCU may be arranged to detect a transition in the ignition state of the vehicle and adjust the sample rate accordingly. The transition to the ignition on state may trigger sampling at a higher rate than during the ignition off state. This will enable the subsequent cranking mode to be detected by reference to measured voltage. The initiation of the cranking mode may be detected when it is determined that the measured voltage has dropped below a predetermined threshold. The threshold may be set by reference to a reference voltage, such as a steady state voltage achieved in an ignition off state between driving cycles. The steady state voltage may be an open cell voltage (OCV). The determined voltage used in obtaining the steady state voltage may be a single measured value or a rolling average of a number of immediately preceding measurements e.g. the last 5 measurements. The steady state voltage may be the voltage in an ignition off state preceding the ignition on state (and may be in relation the immediately preceding ignition off state or a previous ignition off state, depending upon whether steady state voltage was reached in the previous ignition off state or not).

The voltage may be sampled during the ignition off state of the vehicle. Thus, in embodiments, the method may further comprise obtaining data indicative of the voltage of the battery during an ignition off state of the vehicle. In some embodiments, if the ignition off state exceeds a predetermined duration, the TCU may be arranged to enter a standby mode. A standby mode may be a mode in which the TCU is powered, but is not able to transmit data to a server, and in which no position data is captured (as it is assumed that the vehicle is stationary). When the vehicle is in an ignition off state, or at least when in a standby state, voltage measurements may be triggered to be transmitted once more when the next ignition on state is initiated. Voltage measurements may then be taken throughout the next ignition on state of the vehicle e.g. during cranking and drive modes of the vehicle.

Detection of transitions between ignition off and on states of the vehicle may be achieved using an appropriate connection of the TCU, as described above. In more complex arrangements, it is envisaged that detecting transitions between ignition on and off states may involve detecting transitions between states of an ignition switch e.g. using the TCU. For example, this may enable accessories activate, cranking and drive modes of the vehicle to be detected based on the state of the ignition switch. However, simply being able to detect a transition between ignition off and on states of the vehicle (without being able to detect a transition between modes within these states) has been found to be sufficient to implement the methods described herein, and provides a simpler arrangement, which may be implemented using a basic three wire connection of a TCU. The transition between modes within an ignition on state of the vehicle may be detected by reference to measured voltage values as described herein.

The duration of the cranking mode i.e. the duration of engine cranking/start-up may range from a couple of hundreds of milliseconds to around 2.5 seconds or even more. The sampling rate during ignition on state may be selected as appropriate, having regard, e.g. to any hardware constraints, and to try to ensure that data of a sufficient resolution is captured during the cranking mode. By way of example, the voltage may be sampled hourly in the ignition off state, and at a rate of 50 Hz or even higher in the ignition on state. Of course, more complex arrangements may be envisaged, involving using differing sampling rates dependent upon the mode of the vehicle within the applicable ignition state, or dependent upon whether the TCU has entered a standby mode etc.

The obtained data indicative of the voltage of the battery at the one or more times during the or each driving cycle may be data received e.g. by a server from a telematics control unit of the vehicle. The telematics control unit may be arranged to obtain the voltage data through measurement of the battery voltage in any suitable manner. The battery voltage may be measured using an analogue to digital converter (ADC) of the TCU. This may be achieved through providing a suitable hardware connection between the TCU and the vehicle battery. The obtained data indicative of the voltage of the battery at different times during one or more driving cycle of the vehicle may be timestamped voltage data e.g. received from a TCU. The obtained data is preferably real-time voltage data. Thus, in some embodiments, the obtained voltage may be "raw" voltage data, received e.g. from a TCU. In other embodiments, it is envisaged that some processing of the voltage data may be performed e.g.

by the TCU, prior to transmission to a server. Thus, the obtained voltage data may be data indicative of one or more features of interest determined (e.g. by the TCU) using the voltage measurements, rather than the raw data. The voltage data may comprise average voltage values determined using voltage measurements. In other embodiments, the obtained data may be data resulting from the sampling of the voltage in any suitable manner. For example, depending upon e.g. hardware constraints, it is envisaged that the sampling rate of the data that is obtained e.g. received by a server from a TCU, may be lower than that of the sampled data as measured by the e.g. TCU. For example, the TCU may be arranged to average the last e.g. 5 voltage values obtained through sampling at the applicable rate, and to transmit this averaged data to a server, or use this data for the purposes of further processing.

It will be appreciated that where voltage data is received from a TCU, such data may be transmitted continually i.e. as it is sampled, e.g. substantially in real-time. This may take place at least during an ignition on state of the vehicle. In embodiments, transmission of the voltage data may be triggered by the initiation of an ignition on state of the vehicle. Data may then be transmitted until the driving cycle ends i.e. until the next transition to an ignition off state of the vehicle. During the ignition off state of the vehicle, the TCU may record voltage measurements e.g. at the lower sampling rate associated with the ignition off state of the vehicle, and store the measurements off-line, until the next transition to an ignition on state of the vehicle is detected. At least some of the stored measurements, or an average value based thereon, may be transmitted upon the next transition to an ignition on state. For example, a rolling average of the last e.g. 5 voltage measurements may be maintained during the ignition off state, and the most recent such average value may be transmitted upon the next transition to an ignition on state of the vehicle. This may help to reduce the bandwidth required for communication between the TCU and server at times where the voltage data is of less importance/when it does not require processing by the server. The transmission of voltage data e.g. by the TCU may be a wireless transmission.

The data indicative of the timing of one or more driving cycles of the vehicle may be obtained in any suitable manner. A driving cycle may be detected using data obtained relating to the operation of the vehicle in any suitable manner. In embodiments the data indicative of the timing of the or each driving cycle is obtained based on data obtained by a telematics control unit (TCU) of the vehicle. The driving cycle data may be obtained by the TCU, or may obtained e.g. by a server using data received from the TCU. The data indicative of the timing of the one or more driving cycles may be obtained using data indicative of an ignition state of the vehicle. The data indicative of the timing of the one or more driving cycles may be obtained based on data indicative of the timing of one or more transitions of the vehicle between ignition off and ignition on states of the vehicle. Such data may be received from a TCU of the vehicle. Optionally the data indicative of the transition of the vehicle between ignition on and off states may be obtained using data indicative of a state of an ignition switch of the vehicle e.g. based on data indicative of the timing of one or more transition of the vehicle between different modes corresponding to states of the ignition switch. Alternatively or additionally, the data indicative of the timing of the one or more driving cycles may also be based on the data indicative of the voltage of the battery at a plurality of different times e.g. the obtained data indicative of the voltage of the battery at a plurality of different times during each one of the one or more driving cycles. For example, a drop in the voltage measured may be indicative of the initiation of a cranking mode i.e. start-up, as described above. Preferably data is determined indicative of the timing of a plurality of driving cycles of the vehicle. The one or more, or plurality of driving cycles may correspond to the one or more, or plurality of driving cycles for which voltage data is obtained.

The step of obtaining data indicative of the timing of the one or more driving cycles of a vehicle may comprise receiving such data from the vehicle, optionally from a telematics control unit associated with the vehicle. Thus, in some embodiments, the driving cycle timing data may be determined at the vehicle e.g. by a telematics control unit associated with the vehicle. In other embodiments the method comprises determining the data indicative of the timing of the one or more driving cycles of the vehicle using data received from the telematics control unit of the vehicle. This may be performed by a server using data received from the vehicle/telematics control unit thereof. Where the TCU only transmits data to the server during driving cycles, the timing of the received data may itself be indicative of the timing of the driving cycles. Any transmission of the timing data may occur wirelessly i.e. over the air interface.

The method may comprise receiving a feed of voltage data from a TCU associated with the vehicle and/or a feed of ignition state transition data from the TCU. The or each feed may be a live feed.

Voltage data (and, where applicable ignition state transition data or any other data) received from a TCU of a vehicle may be stored before use in the methods of the invention. In embodiments the method may comprise receiving voltage data (and optionally ignition state transition data) from a TCU associated with the vehicle, and storing the data in a database of vehicle battery related information for use in the methods described herein. The step of obtaining the voltage data for use in the method may then comprise obtaining the data from the database. Thus, references to obtained e.g. voltage data being received from a TCU of a vehicle should be understood to encompass the received data being first stored. It will be appreciated that the data may be received and stored in a database at a first server and then obtained from the database by another server which implements the methods described herein, or the first server may both receive and store the data and then use it in the methods described. Any arrangement is possible. In general, the step of obtaining data e.g. voltage data received from a TCU of the vehicle may therefore comprise obtaining such data from a database or may involve receiving the data. The same may apply to other data e.g. ignition state data obtained from a TCU.

Wherever the driving cycle timing data is determined, i.e. by the server or at a vehicle e.g. by a telematics control unit thereof, or some combination thereof, the data is preferably obtained based on data indicative of an ignition state e.g. ignition on or off state, or optionally a state of an ignition switch of the vehicle, and data indicative of the voltage of the vehicle battery at different times. The data indicative of the ignition state e.g. an ignition on or off state, or a state of an ignition switch may be obtained, for example, by a TCU through an appropriate connection to the wiring of the ignition switch.

The method may comprise obtaining one or more voltage related parameters in respect of the driving cycle using at least some of the data indicative of the voltage of the battery at a plurality of different times during each one of the driving cycles of the vehicle. It will be appreciated that determining a particular voltage parameter may only require a part of the voltage data e.g. relating to a particular driving cycle, or a particular portion of one or more driving cycles.

The one or more voltage related parameters may include a difference between the first two minima detected in the voltage after initiation of a cranking mode of a driving cycle i.e. after initiation of start-up/cranking. Such a parameter may be determined in relation to one or more driving cycles. The parameter may be determined in relation to each new driving cycle in respect of which voltage data is received. For use in determining the starting probability factor for a given time, the difference between the first two minima detected in the voltage after initiation of the cranking mode in relation to the most recent driving cycle may be used.

The one or more voltage related parameters may include a voltage of the battery immediately prior to initiation of the cranking mode e.g. a voltage of the battery i.e. while the vehicle is in an ignition on state.

The method may comprise analysing the behaviour of the voltage at and after initiation of the cranking mode in one or more, or each driving cycle. The method may comprise analysing an initial voltage drop occurring upon initiation of the cranking mode. This parameter may be useful in assessing the state of health of the battery. The initial voltage drop should be instantaneous, and should correspond to the lowest value of voltage reached during cranking mode. The timing and/or magnitude of the initial voltage drop may be determined.

In preferred embodiments, as mentioned above, the method further comprises obtaining data indicative of the voltage of the battery at a plurality of different times between driving cycles, and optionally between more than one set of consecutive driving cycles. In embodiments, the one or more voltage related parameters may include an open circuit voltage (OCV). An open circuit voltage corresponding to a steady state voltage achieved after the end of a driving cycle may be determined. The time taken to reach a steady state voltage may vary depending upon environmental conditions. Thus, such a steady state voltage may not always be obtainable after a particular driving cycle. The open circuit voltage may be based on a steady state voltage achieved after the end of one or more driving cycle. Thus, the steady state voltage may be an average value based on the voltage achieved after multiple driving cycles, or may be a steady state voltage based on the last steady state voltage achieved after the end of a preceding driving cycle (which may or may not be the immediately preceding driving cycle).

The set of one or more driving cycle related parameters may include an average duration of a driving cycle and/or an average interval between driving cycles. The average may be based on any desired number of previous cycles e.g. 10. A rolling average may be determined to enable the parameter to be monitored.

The method may comprise determining one or more battery parameters. The one or more battery parameters may be used in determining the starting probability factor for the battery in respect of one or more times. Thus the one or more battery parameters may be in respect of the one or more times. The one or more battery parameters may be updated e.g. monitored continually or on a regular basis, or in relation to each new driving cycle etc. This may provide appropriate up to date data upon which to determine the starting probability factor for a particular time. The one or more battery parameters may be determined, and preferably monitored, in real time. The one or more battery parameters may be obtained using at least some of the one or more driving cycle related parameters and at least some of the one or more voltage related parameters obtained. Other data may be used in obtaining the one or more battery parameters. For example, data input by the user may be used.

The method may comprise determining a state of charge (SOC) of the battery. The SOC of the battery is indicative of the amount of energy available in the battery. In embodiments the SOC of the battery is based on at least some of the obtained one or more driving cycle related parameters and at least some of the obtained one or more voltage related parameters. The one or more driving cycle related parameters used in obtaining the SOC may include an average duration of a driving cycle and an average interval between driving cycles. The SOC of the battery may also be based on one or more voltage related parameters relating to the cranking mode i.e. start-up/cranking part of a driving cycle. The driving cycle considered may be a most recent driving cycle (for which data is available). The voltage related parameter may be a difference between the first two minima in the voltage after initiation of a cranking mode in the driving cycle. Other data may be used in obtaining the SOC of the battery. Where a steady state Open Cell Voltage (OCV) is determined as described above, this may be used to calibrate the SOC of a battery.

Alternatively or additionally the method may comprise determining a state of health (SOH) of the battery. The SOH of the battery is indicative of the absolute capacity of the battery for energy storage. In embodiments the SOH of the battery is based on one or more driving cycle related parameters and one or more voltage related parameters obtained using the data indicative of the timing of the driving cycles and the data indicative of the voltage of the battery during each one of the driving cycles of the vehicle. The SOH of the battery may be based on a number of driving cycles the battery has undergone (i.e. since being installed in the vehicle) and a battery age. Other data may be used in obtaining the SOH of the battery. The data may include an age of the battery. The battery age may be determined based on data input by the user. Such data may include a manufacturing date of the battery, and the date of any battery replacement.

The determination of the SOH or SOC of a battery may also take into account a type of the battery. Such information may be obtained based on data input by the user. The invention is applicable to any type of battery which may be used to crank the engine of a vehicle. For example, the battery may be a lead-acid battery. Within this category, the battery may be a wet cell (flooded) or valve regulated lead acid battery. The latter category may be further sub-divided into absorbed glass mat (AGM) and gel cell batteries.

In preferred embodiments the starting probability factor for a given time is based on an applicable SOC and SOH determined for the battery. Thus, the SOC and SOH applicable for the given time will be used in determining the starting probability factor. The given time may be a current time, with the SOC and SOH then being the current SOC and SOH for the battery. In order that the starting probability factor may be determined for any time, it is desirable that the SOC and SOH of the battery are monitored (e.g. continually).

In order to provide up to date information, the obtained data indicative of the voltage of the battery at a plurality of different times during each of the plurality of driving cycles of the vehicle includes data indicative of the voltage of the battery at a plurality of different times during a most recent driving cycle. The driving cycle may be a current driving cycle, or a most recent completed cycle. As mentioned above, the method may comprise storing the received voltage and timing data e.g. by a server. This may enable driving cycle and, in some cases, voltage parameters to be obtained taking into account multiple cycles e.g, average values, total number of cycles etc.

Other battery parameters may be determined. For example a cranking amps (CA) of the battery indicative of the speed at which energy may be dissipated may be determined. This may be determined by analysis of the voltage data.

The starting probability factor is preferably based on both live and historical data i.e. voltage and/or ignition switch transition data.

The energy which may be delivered by a battery is generally directly proportional to the temperature of the battery, while the energy required to start the engine is inversely proportional to temperature in the surrounding environment. In view of this, the determination of the starting probability factor preferably takes into account temperature. In preferred embodiments, the starting probability factor in respect of a given time is dependent at least in part upon the temperature expected at a position of the vehicle at the given time. The temperature may be determined at least in part using weather data applicable to the given time. The weather data may be obtained from a server providing weather data. The weather data may be indicative of current or future weather conditions, depending upon whether the time to which the starting probability factor relates is a current or future time. Thus, in these embodiments, the starting probability factor is determined in part based upon data received from a vehicle e.g. from a TCU thereof, and in part received from another source e.g. a server providing weather data.

The method may comprise using data indicative of a position of the vehicle to select weather data applicable to the position of the vehicle. The position data may be obtained from the vehicle. The method may comprise obtaining data indicative of the position of the vehicle at different times. The position data may then be used in selecting the applicable weather data. The positional data may be data received from the vehicle, and may be provided as a feed, e.g. a live feed. The data may be time stamped positional data. The data is preferably real time positional data. Such data may e.g. be GPS data or any other positional data. The positional data may be received from any suitable positioning system of the vehicle. Thus, such data may or may not be received from the TCU of the vehicle. As described in relation to the voltage data above, obtaining the positional data may involve receiving the data or obtaining the data from a database of received data. The method may extend to the step of receiving the data and storing the data in a database.

It will be appreciated that the temperature at a given position as indicated by weather data may not correspond to the temperature of the battery when the vehicle is located at the position. For example, a difference may exist between the temperature of the environment and that under the hood of the vehicle. It is also possible that vehicle battery may experience a local temperature which is different to that expected based on the position of the vehicle e.g. if the vehicle is parked in sunlight, or the vehicle is in a garage etc. For some applications, it may be sufficient to take the temperature of the position of the vehicle as indicated by weather data to correspond to that experienced by the battery. Taking the temperature into account in some manner will generally improve the accuracy of the starting probability determined. However, in some embodiments, the method may comprise determining a correction to the temperature at the position of the vehicle as indicated by the weather data. This may provide a way to attempt to more accurately reflect the temperature experienced by the battery. The method may comprise using one or more temperature measurements from one or more temperature sensors associated with the vehicle to determine a correction to the temperature. The temperature sensors may include any one or ones of; a temperature sensor of a TCU of the vehicle (where present), an oil temperature sensor for the vehicle and a water temperature sensor for the vehicle. Engine usage history may also be used in determining whether any adjustment to a temperature obtained according to weather data is required. For example, an interval since the preceding driving cycle may be taken into account. If the preceding driving cycle was recent, the vehicle battery may be expected to still be hot in comparison to the case in which the interval is long e.g. where the vehicle has been parked for 24 hours.

In addition to temperature, other weather data applicable to the position of the vehicle at the given time may be taken into account, such as any one or ones of; humidity, air pressure or sun coverage. These weather conditions may all have an impact on the operation of the battery. This may be obtained in any of the manners described with respect to temperature data.

As mentioned above, the starting probability factor is preferably determined taking into account a SOH and SOC of the battery. The SOH is indicative of the health of the battery i.e. the extent to which it is decayed (due to age and number of driving cycles experienced). The SOC is indicative of the state of charge of the battery.

The starting probability factor is determined in respect of one or more given time. A time may be a past time, a current time and/or a future time. The one or more given times preferably include a current time. The method may comprise determining the starting probability factor in respect of a plurality of different times. The method may be repeated for successive current times. In some preferred embodiments, the starting probability factor is monitored, and may be determined on a continual basis. Thus, the factor may be determined as a continuous function. The factor may be a percentage likelihood of the engine starting. While the starting probability factor is preferably determined automatically e.g. on a continual basis, or at intervals, or as desired, it is envisaged that it might alternatively only be determined upon request by a user e.g. by opening an app. This may be performed at any of the times discussed in relation to generating information for output to the user. Thus the starting probability factor may be determined only when data is required to be generated for output.

The step of using the determined stating probability factor to generate information for output to a user may be performed for one or more different times. The step may be performed automatically e.g. at intervals, or at one or more predetermined times, or in response to a particular condition being met e.g. a significant change in the starting probability factor or the factor falling below a predetermined threshold etc. Alternatively or additionally, the step may be performed in response to an indication by the user that information is required. A user as referred to herein may be a driver i.e. an end user of a vehicle, a fleet manager, or a mechanic, or anyone having an interest in the starting probability of the vehicle. The information may be output to one or more user, and optionally to a plurality of different users. Thus, the starting probability factor may be determined in respect of a plurality of different times (e.g. continually), with information being generated for output to a user in respect of only a subset of the one or more times e.g. when requested by a user.

The method may comprise the step of transmitting the generated information to one or more device associated with a user and/or to a system associated with the vehicle for output e.g. display. For example the information may be transmitted to one or more device, such as a mobile device or a PC associated with a user. Alternatively or additionally, the information may be transmitted to system associated with the vehicle for output via a display associated with the vehicle. The system may be an Advanced Driver Assistance System (ADAS) or other system capable of providing in-vehicle information to the user. The method may extend to the step of outputting e.g. displaying the generated information to the user or users. The data may be output to the user via an app. For example, this may be carried out when the user opens the app, or as a notification pushed to the user under given circumstances depending upon user set preferences etc.

The information based on the starting probability factor for the applicable time which is generated for output may be the starting probability factor, or information otherwise based thereon. The information may be a warning, advice or prompt to the user selected based on the applicable starting probability factor i.e. the starting probability factor applicable to the given time. The information may be a warning that the battery is unlikely to start the vehicle. Such a warning may be provided when the starting probability is below a predetermined threshold (and, in embodiments may be automatically triggered when the probability falls below the threshold). Alternatively or additionally, information based on the starting probability factor may be advice to the user, or a prompt to the user to take some action. For example, where the starting probability factor is below a given threshold, a recommendation to replace the battery may be provided, in addition or alternatively to a warning as previously described.

Where the starting probability factor is at an intermediate level, an SOC and/or SOH of the battery may be used in determining the information to be output to the user. For example, where the battery is healthy but discharged, i.e. the SOH is good, but SOC less than optimum, the user may be advised to check for any parasitic loads straining the battery and/or to use longer driving cycles and/or to recharge the battery using an external power source. The information determined for output may depend upon one or more of the determined driving cycle related parameters and/or one or more of the voltage related parameters.

For example, the advice to check for parasitic loads may be provided where an OCV of the battery exhibits a steep drop, while the advice to increase the length of driving cycles may be provided where the driving cycle data indicates that there is a long interval between driving cycles and/or a short duration of the cycles. Subsequently, after the user has taken account of any such advice, the SOC of the battery may be determined once more, and, if the SOC is still below a predetermined threshold, the user may be provided with a start-up warning. If the SOC is in an intermediate range, advice may be given depending upon temperature. For example, where the temperature is above a predetermined level, it may be determined that start-up is expected to be successful, whereas if temperature is below the predetermined level, it may be determined that an issue with start-up may be expected.

Where the battery is decayed and charged i.e. SOC is good, but SOH is less than optimal, the user may be prompted to replace the battery. However, in some cases, battery replacement is only advised in certain situations. For example where the SOH of the battery is below a predetermined threshold, and the temperature is below a predetermined threshold. If the temperature is higher, the battery may be expected to start the vehicle despite its decayed state.

In embodiments a fuzzy logic algorithm is used to determine the information to be output to the user when the starting probability factor is in an intermediate range, taking into account one or both of the SOH and SOC of the battery.

The voltage data with respect to time which may be obtained in accordance with the invention may be analysed to identify other features which may be used to alert the user.

The method may further comprise using obtained data indicative of the voltage of the battery during one or more previous driving cycles to verify the operation of the alternator of the vehicle. Where there is no evidence of alternator activity the driving cycle(s), a warning may be provided. The operation of the alternator may be verified by consideration of the OCV of the battery after startup, while the engine is running i.e. when the vehicle is in a drive mode. Where the OCV is below a predetermined threshold e.g. 14V, it may be determined that there is a problem with the alternator. Such an OCV may be determined by analysis of the voltage data.

The method may also provide a way to identify when parasitic loads are present. A parasitic load is a device which uses the electrical energy when the vehicle is in a locked mode, and the doors are locked. The parasitic loads may be lights left on mistakenly, or devices connected to the electrical socket of the vehicle. Where a parasitic load is present, a "steep" OCV drop when in the locked mode may be identified. Thus, the OCV between driving cycles may be used to identify the presence of possible parasitic loads.

The method may comprise alerting the user when the existence of possible parasitic loads has been identified.

In embodiments, the method further comprises monitoring an OCV of the vehicle during and/or between driving cycles, and optionally using the OCV to identify the existence of parasitic loads and/or to verify operation of the alternator.

The methods of the present invention are performed remotely i.e. remotely from the vehicle based on detected data. Preferably the methods are performed by a server. Preferably the method is performed using data obtained by a telematics control unit of the vehicle. For example, voltage and ignition state transition data may be received from a TCU. Data from other sources may also be used e.g. data from a weather server, data input by a user etc.

If appropriate, some calibration of the voltage measurements may be performed. This may be useful where the voltage is measured by an ADC of a TCU. The calibration may then be performed by the TCU or by a server receiving the voltage data. Such arrangements are advantageous, in that they avoid the need to provide additional hardware, but the absolute voltage measured by the ADC may not necessarily correspond to the voltage which would be obtained if measured at the battery terminals.

Calibration may be performed by comparing the voltage measured by the TCU's ADC and that measured by an oscilloscope connected to the vehicle battery's terminals directly. However, this calibration need not always be performed. In embodiments at least, in which voltage parameters based on relative values are used e.g. a difference between the first two minima after initiation of cranking mode, calibration may not be required.

Although the methods described herein have been described in relation to a server performing various steps, the methods may be performed in any location, or by any system or systems, including a server or device e.g. TCU associated with a vehicle, or combinations thereof. Thus, any steps of the processing described may occur at the vehicle e.g. using a TCU or at a server, unless the context demands otherwise.

As mentioned above, the starting probability factor, and any of the other parameters described e.g. driving cycle parameters and/or voltage related parameters, and/or battery parameters, may be determined using historical data, alone or in combination with live data, unless the context demands otherwise.

References to "monitoring" used herein refer to determining a parameter on an ongoing basis, at regular or irregular intervals. Continual monitoring may involve determining a value of the parameter as a continuous function, which may be based on discrete data samples e.g. such that a determined value is considered to be applicable until the next value is determined etc.

As used herein, "live" data refers to data which is considered to be representative of current conditions e.g. a current position of the vehicle, weather conditions, voltage of the battery etc. Live data may be thought of as data which is relatively current and provides an indication of relatively current conditions. The live data may typically relate to the conditions within the last 30 minutes, 15 minutes, 10 minutes or 5 minutes. It will be appreciated that live data may be stored before being used.

In this context the words "historic" or "historical" should be considered to indicate data that is not live, that is data that is not directly reflective of conditions at the present time or in the recent past (perhaps within roughly the last five, ten, fifteen or thirty minutes).

It will be appreciated that the methods in accordance with the present invention may be implemented at least partially using software. It will this be seen that, when viewed from further aspects, the present invention extends to a computer program product comprising computer readable instructions adapted to carry out any or all of the method described herein when executed on suitable data processing means. The invention also extends to a computer software carrier comprising such software. Such a software carrier could be a physical (or non-transitory) storage medium or could be a signal such as an electronic signal over wires, an optical signal or a radio signal such as to a satellite or the like.

The present invention in accordance with any of its further aspects or embodiments may include any of the features described in reference to other aspects or embodiments of the invention to the extent it is not mutually inconsistent therewith.

Advantages of these embodiments are set out hereafter, and further details and features of each of these embodiments are defined in the accompanying dependent claims and elsewhere in the following detailed description.

BRIEF DESCRIPTION OF THE DRAWINGS

Some preferred embodiments of the present invention will now be described, by way of example only, and with reference to the accompanying drawings, in which:

FIG. 5 illustrates the way in which SOH may depend upon the number of cycles experience by the battery and the battery age;

FIGS. 6A, B and C illustrate the way in which battery age, number of starting cycles, and SOH may be categorised respectively;

FIG. 9 illustrates the voltage behaviour during cranking for two start-up cycles.

DETAILED DESCRIPTION

Figure 1A:
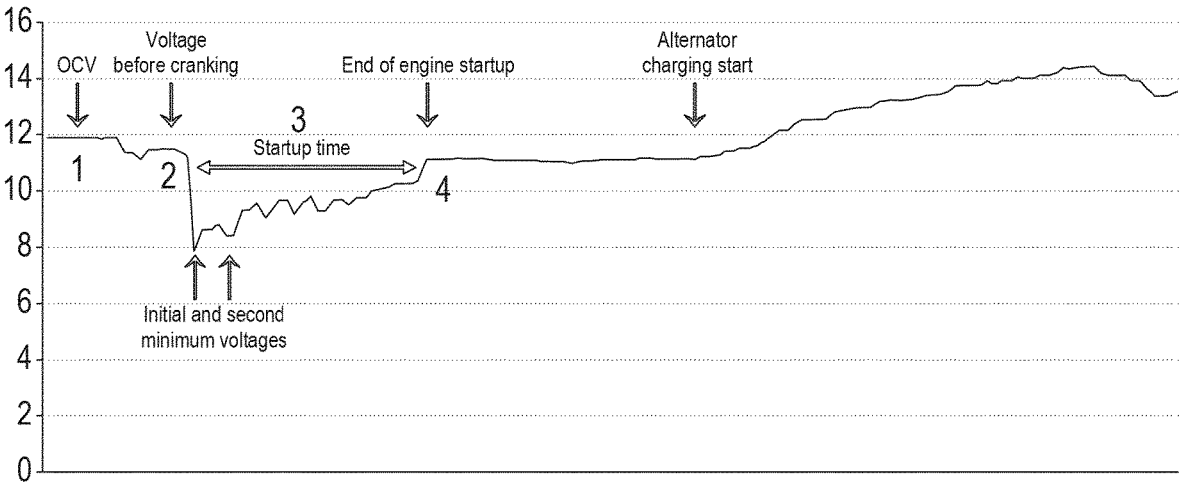
FIG. 1A shows voltage with respect to time before, during and after engine start-up, indicating various elements that can be detected from voltage measurements during engine cranking.

In embodiments at least, the present invention provides a method which enables a starting probability of a vehicle battery to be remotely monitored by a server, and a user alerted when there may be an issue with the ability of the battery to start the vehicle. The method is performed by analysing voltage and ignition state data received from a TCU of a vehicle.

In accordance with one exemplary embodiment of the invention, the voltage of a vehicle battery is measured with the aid of the analogue to digital converter (ADC) of a Telematics Control Unit (TCU). While the main purpose of a TCU device is to retrieve various controller area network (CAN) information such as odometer or error messages, it has been found that its applications can be extended with the aid of an algorithm as described herein, with no need of extra hardware and only an additional payload to the data communication.

The TCU hardware is connected directly to the battery to enable voltage measurements for use in the algorithm described herein to be obtained. A connection from the TCU to the hard-wired ignition switch is also provided. The latter connection is already used in some previous applications.

The voltage of the battery is sampled by the ADC of the TCU at different sampling rates, depending whether the car is in an ignition off or ignition on state. The voltage measurements are transmitted to a server for use as an input to the algorithm described below.

The driving cycle of a vehicle may be detected with the aid of the hard-wired ignition switch and the voltage readings. The TCU installation follows a so-called 3-wire installation (+CAN connection). 3-wire stands for Power, Ground and Ignition. Once connected to these three wires of the vehicle CAN, the TCU can determine whether the vehicle is in an ignition on or ignition off state.

When the vehicle is in an ignition off state, the sampling rate will be low, e.g. hourly. The TCU maintains a rolling average of the last five voltage measurements, and stores the most recent such average value. When the next transition to an ignition on state is detected, the most recent average voltage value from the ignition off state is transmitted to the server. It will be appreciated that if the ignition off state exceeds a predetermined duration e.g. 2 hours, the TCU may enter a standby mode until the next transition to an ignition on state is detected. In the standby mode, voltage measurements continue to be taken and stored, but certain functionality of the TCU is disabled. For example, position data e.g. GPS data may not be taken, as it may be assumed that the vehicle is stationary. A modem of the TCU may be disabled, such that the voltage measurements are stored locally without transmission to the server. When the vehicle is in an ignition off state prior to entering a standby mode, data may be stored for later transmission in a similar manner to that during standby, or may be transmitted to the server.

Upon detection of a transition to an ignition on state, the TCU starts to sample voltage at a higher sampling rate, and to transmit voltage measurements to the server. This ensures that data of an appropriate resolution is captured to enable sufficient information about the subsequent cranking mode and drive mode to be obtained. At The TCU continues to sample voltage data and transmit it to the server at the higher sampling rate until the next transition to an ignition off state is detected, at which time the sampling rate decreases once more, and voltage data is stored for subsequent transmission (upon initiation of a further ignition on state).

The rate at which voltage measurements are taken when the ignition on state is initiated is drastically increased compared to that in the ignition off state, due to the relatively short time that cranking takes. A resolution of 10 ms would be ideal in order to detect local and global peaks, i.e. to detect start-up timings and revolutions. However, in practice the resolution achievable is limited by hardware, as the TCU should not be overloaded, as this may interfere with its ability to perform other conventional functions of the TCU e.g. downloading of CAN signals. It has been found that a data rate of 40 milliseconds per sample may provide a balance between providing a useful data resolution and avoiding overloading of the TCU.

By way of example, voltage measurements may be taken hourly in the ignition off state, and at 50 Hz during an ignition on state. Of course, more complex arrangements may be envisaged in which transitions between modes of the vehicle are detected by reference to a position of an ignition switch e.g. accessories activated mode, cranking mode, drive mode. The voltage sampling rate may differ between these modes.

FIG. 1A shows the various elements that can be detected from voltage measurements during engine cranking. The open circuit voltage (OCV) (1) can be observed at the leftmost side of the figure. This figure illustrates the different voltage states which may be identified, and how they relate to the mode of vehicle e.g. a state of an ignition switch. In the region labelled 1, the vehicle is in a "locked" mode, in which the battery supplies energy only to the anti-theft and other low power consumption specific loads. The vehicle is in an ignition off state. In the left hand region 2, the ignition has transitioned to an ignition on state. All of the electrical consumers in the car are being activated (AC/seat heating/radio etc.). This may be referred as an "accessories activated" mode. Region 3 corresponds to the period when the key is in the ignition position, i.e. the engine is starting/cranking. This corresponds to the cranking mode of the vehicle. In region 4 engine start-up has finished, and the vehicle is in drive mode. FIG. 1A labels various features of the voltage which may be used in accordance with the invention. These include the Open Circuit Voltage (OCV) steady state voltage in the locked mode 1, the voltage before cranking occurs in region 2, the first and second minima in voltage after initiation of start up in region 3, the start up duration corresponding to the duration of region 3, the end of engine start up, and the start of alternator charging.

Figure 1B:
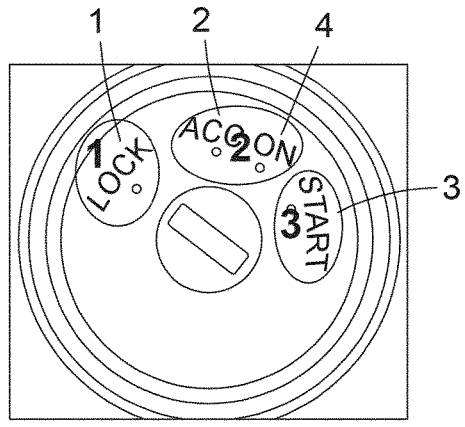
FIG. 1B illustrates the way in which the regions indicated in FIG. 1A correspond to positions of the ignition switch.

FIG. 1B illustrates the way in which these states correspond to positions of the ignition switch. In the region 1, the switch is in the "lock" position. In region 2 the switch is in the "acc" i.e. accessories activated position. In region 3 the switch is in the "start" position. In region 4 the switch is in the "on" position (i.e. for driving).

As mentioned above, it is not necessary to detect the positions of the ignition switch. By capturing voltage data e.g. as illustrated in FIG. 1A, the transition between modes within an ignition on state of the vehicle may be identified. Thus, in embodiments, only a transition between ignition off and ignition on states of the vehicle is detected, in order to adjust the sampling rate appropriately to ensure that the resulting data is of a sufficient resolution to enable certain features of the voltage during the various modes within the ignition on state to be identified.

Figure 2:
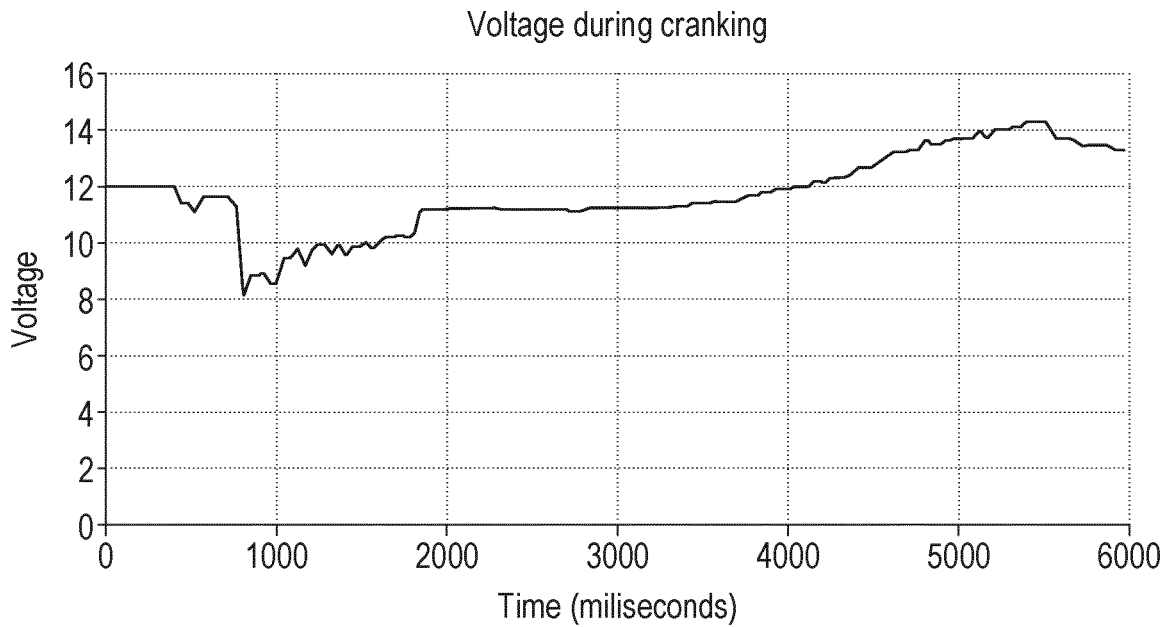
FIG. 2 illustrates the behaviour of the voltage during start-up in more detail.

The behaviour of the voltage during start-up can also be analysed. This is shown in FIG. 2. The initial voltage drop should be instantaneous, and should be the lowest value reached during cranking. The voltage drop may be taken to define the start of the engine cranking mode. As the engine RPM increases, the load on the electromotor decreases and the battery voltage recovers. There might be some local peaks corresponding to the high mechanical resistance induced by the compression process of the 4-stroke engines.

In the example of FIGS. 1 and 2, the cranking time is approximately 1 second. However, this time i.e. the duration of the cranking mode can vary from a couple hundreds of milliseconds to 2.5 seconds, or even more. A calculation of the cranking time may be performed. After the engine is running on itself i.e. in the drive mode, depending on several factors, such as SOC, temperature, Engine Control Unit (ECU) management etc., the alternator may start charging the battery.

The voltage measurement may be calibrated. Ideally, the battery voltage would be measured at the battery terminal. However, this would mean extra hardware would need to be implemented. It is recognised that the voltage measurements obtained using the ADC of a TCU might be lower than the actual voltage drop over the battery, due to the series voltage drop over the wires or diodes/fuses. Calibration may be done by comparing the voltage measured by the TCU's ADC and the one measured by an oscilloscope connected to the batteries terminals directly.

Figure 3:
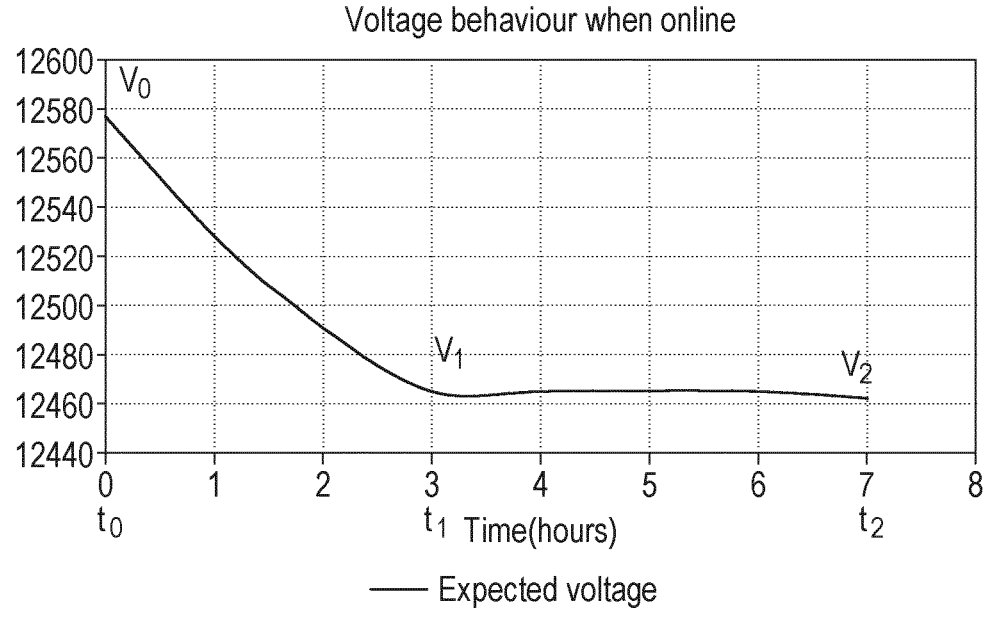
FIG. 3 illustrates the voltage behaviour while the vehicle is not running.

The voltage behaviour while the vehicle is not running i.e. in an ignition off state will now be discussed by reference to FIG. 3. In FIG. 3, the typical evolution of the battery voltage is shown when the vehicle is not running. $V_0$ represents the battery steady state OCV after the end of a driving cycle. As soon as the engine is turned off, it is expected for the voltage to drop linearly to $V_1$, as the surface charge induced by the alternator wears off. Afterwards, at $t_1$, the voltage is expected to vary, but to steadily decrease overall. $V_2$ is the voltage before the next driving cycle, i.e. before the driver starts the car again. The time difference between $t_0$ and $t_2$ can range from a couple of minutes to even months. Depending on the environment conditions, the steady state of the battery may be reached during this interval. If so, it may be taken as a reference for the SOC. Thus, a reference voltage corresponding to the steady state of the battery may be determined using this data relating to the voltage of the battery between driving cycles.

In accordance with the invention, the voltage measurements obtained by the TCU, and data indicative of the ignition state of the vehicle obtained by the TCU are transmitted to a server for use in calculating the starting probability factor (SPF) for the battery. The ignition state data, and the voltage data during the ignition on state of the vehicle, is transmitted to the server in real-time, enabling the SPF for the battery to be monitored i.e. continually updated i.e. to provide a live "SPF". The SPF may be calculated as a continual function in terms of a percentage probability that the vehicle battery will be able to start the vehicle. Alternatively, it is envisaged that the SPF may be calculated on a demand basis i.e. when a user requests information about the state of the vehicle battery. The algorithm may then process the data available for the vehicle at the given time.

One way in which an algorithm may operate to implement an embodiment of the invention will now be described by reference to FIG. 4.

Figure 4:
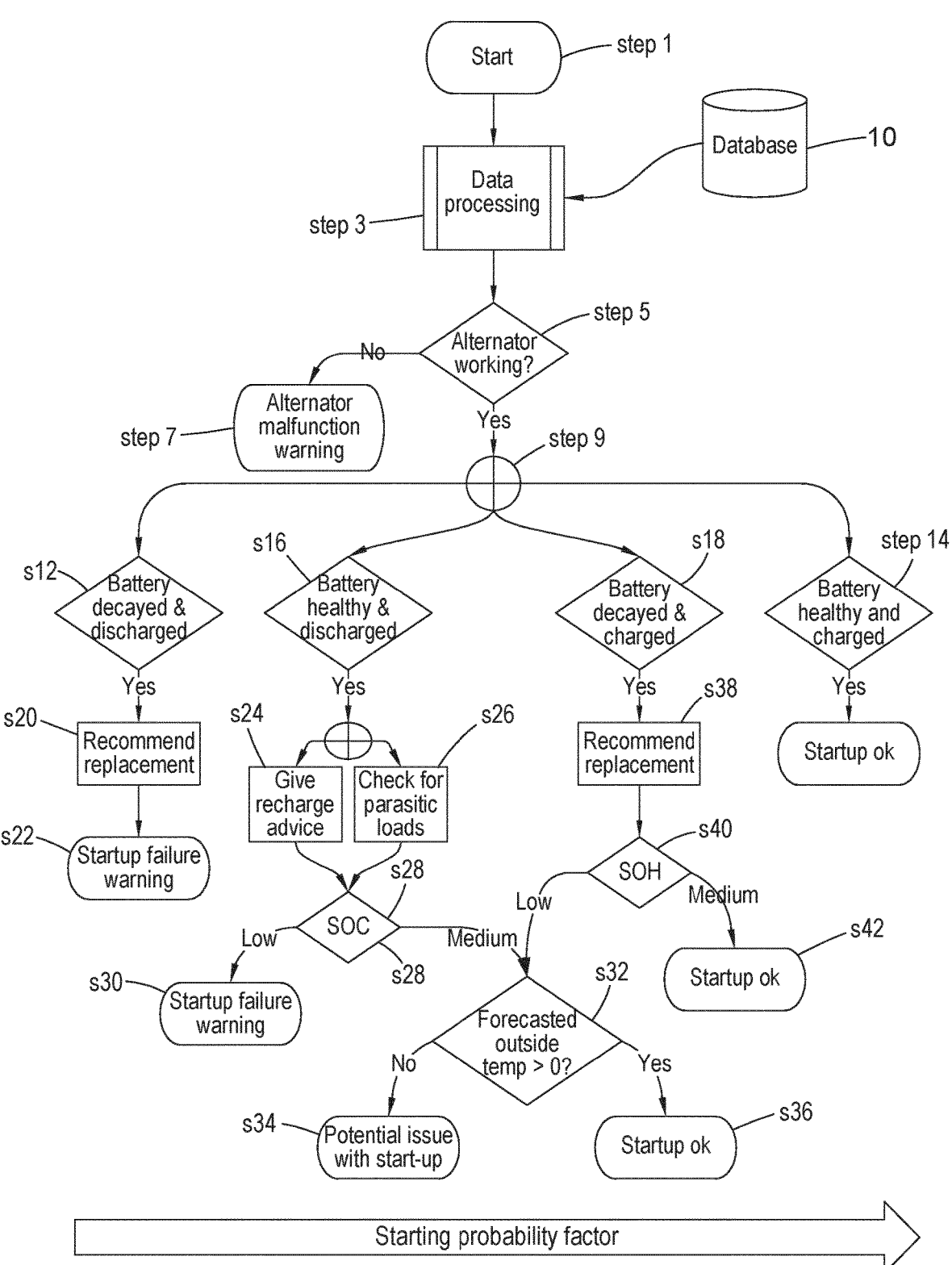
FIG. 4 is a flow chart illustrating a way in which the algorithm may operate in accordance with an embodiment of the invention.

FIG. 4 illustrates a way in which an algorithm may operate using input data from a database 10. The database 10 includes stored voltage and ignition state data obtained from the TCU of a vehicle over time.

The algorithm starts at step 1.

At step 3 data from the database 10 is processed to obtain two battery parameters, SOH and SOC upon which the SPF is based.

A state of health (SOH) for the battery may be determined based on the total number of cycles that the battery sustained since it was installed in the vehicle, as well as the battery age. For convenience, the user will be asked to input if the battery was replaced, its manufacturing date and the battery type (e.g. typically wet cell or AGM). The SOH of a battery is indicative of its absolute capacity for energy storage, and will be affected by the energy loss over time while the vehicle is not driving.

A state of charge (SOC) for the battery will also be determined based on an average duration of a driving cycle and average interval between driving cycles. The SOC also takes into account a difference between the first two minima in the voltage encountered after initiation of start up i.e. cranking mode, as shown in FIG. 1A. If steady state conditions apply as mentioned above, the SOC will be calibrated with the aid of the applicable OCV. The applicable OCV will be the OCV associated with the most recent locked state of the vehicle where steady state voltage was attained. The SOC of a battery is indicative of the amount of energy available in the battery.

It will be appreciated that the average driving cycle duration and the average interval between driving cycles may be determined based upon the voltage data received by the server from the TCU, together with the ignition state data. Such data is stored in the database 10. The combination of the voltage data and the ignition state data enables the timing of driving cycles to be determined (and the timing of individual modes within the driving cycles i.e. the start and end of cranking mode), and thus the cycle duration and interval between cycles may be obtained. As new data is received from the TCU, the average values for these parameters may be updated. Thus, they are based on the historical data received from the TCU and the most recent data received.

In step S the operation of the alternator is checked. If there is no evidence of alternator activity during the previous driving cycles, the algorithm would immediately generate a warning for output to a user—step 7. Without the alternator, a vehicle is prone to stall while driving, if it starts at all. The operation of the alternator may be evaluated by checking historical data of the OCV of the battery after startup, while the engine is running. The OCV should indicate more than 14V when the alternator is enabled.

Provided the alternator checkup is passed, the algorithm will proceed to the next stage—step 9.

As mentioned above, the SPF may be calculated continually, or upon request by a user. In either case, when the SPF for a given time is determined, the algorithm generates an output e.g. message, such as a warning, alert or prompt for the user dependent upon the value of the SPF. Some exemplary output for given levels of SPF will now be described. The output may be provided to a user on a mobile device or other device e.g. PC of the user. The output may be provided via an app. The output may be provided automatically if certain conditions are met e.g. if the SPF falls below a given threshold, or in response to a request by a user. Alternatively or additionally, the output may be provided to a user via a display associated with the vehicle, e.g. of an ADAC thereof. It will be appreciated that the output may be provided to more than one user. The users may be users of the vehicle, or anyone with an interest in the performance of the battery e.g. a fleet manager, someone responsible for maintaining the vehicle etc. The SPF may be in respect of a current or future time.

The starting probability factor (SPF) reflects the likelihood that the battery will be able to start the vehicle, and is dependent upon both SOC and SOH of the battery. The starting probability factor is lowest i.e. 0% where both SOH and SOC are low i.e. the battery is decayed and discharged—condition 12. The SPF is highest i.e. 100% where both SOH and SOC are high i.e. the battery is healthy and charged—condition 14.

If the battery is discharged and decayed (old with many start-up cycles)—condition 12, i.e. where SOC and SOH are both low, the algorithm will generate data to advise the user to replace the battery (step 20) and will generate a warning that the current battery is highly likely to fail while cranking (step 22).

If the battery is healthy and charged (condition 14), a message may be generated indicating that startup is expected to be fine.

Of course, the SPF may have any value between these extremes. The action taken by the algorithm for intermediate values of SPF will now be described by reference to two possible intermediate values, corresponding to conditions 16 and 18, in which the battery is healthy and discharged, and the battery is decayed and charged respectively.

In condition 16, where the SOH is good, but the SOC is not, the algorithm will prompt the user to either check for any parasitic loads straining the battery (step 26), and/or will provide advice on how to recharge the battery (step 24) e.g. to try to use longer driving cycles and/or to externally recharge the battery. The latter advice will be given if the average driving cycles are short and/or infrequent. The existence of any parasitic loads would be associated with a "steep" OCV drop while offline (e.g. the drop as shown in FIG. 3).

After the user has taken any suggested action, the SOC is recalculated—step 28. If the SOC is still extremely low, the algorithm would give a failure warning step 30. Regardless of how healthy the battery is, if the SOC is low, there will not be any potential energy stored in the battery to be supplied. If the SOC is mildly low, the system will check for the forecasted temperature—step 32. A negative (degrees Celsius) ambient temperature might be troublesome for the cranking process. The cranking probability increases with temperature. If the temperature according to weather data is below a predetermined threshold e.g. is zero degrees Celsius or below, a warning may be provided to the user that startup is unlikely to succeed—step 34 ("potential issue with startup). If the temperature is above the threshold, then a message may be provided that startup should be fine—step 36 ("startup ok").

In condition 18, if the SOC is good, but the SOH is not, i.e. the battery is decayed and charged, the algorithm may also advise a battery replacement—step 38. However, this advice may not be provided in all circumstances. If the user keeps the battery charged and the following season is not a cold one, the expected battery cycle life may be exceeded. The algorithm will therefore next consider SOH of the battery—step 40. If the SOH is average, there ought to be no issues with the cranking process, and the algorithm will indicate that startup should be ok—step 42 ("startup ok"). If SOH is low, the algorithm follows step 32, and then step 34 or 36 as appropriate, as described in relation to condition 16.

It will be appreciated that the SPF may have any value within a continuous range between 0% and 100%, and need not be categorised into one of the four conditions 12, 14, 16 and 18 described. For intermediate conditions of the battery, the algorithm is able to determine suitable action using a fuzzy logic approach based on the described conditions. For example, where SOH and SOC are both average, the algorithm may identify a divided approach based on the action taken in relation to conditions 16 and 18 described above.

It will be appreciated that other battery parameters may be determined e.g. cranking amps, which is indicative of the speed at which energy may be dissipated by the battery.

In the example given above, the SOH of the battery is defined as a function of the number of starting cycles and the age of the battery. FIG. 5 illustrates the way in which SOH depends upon these parameters. For convenience the weight factor is evenly distributed between the number of cycles and the age of the battery.

FIGS. 6A, B and C illustrate the way in which battery age, number of starting cycles, and SOH may be categorised respectively.

The SOC may be defined analogously to the SOH, with an added factor quantifying the voltage difference between the first two initial minimum peaks.

Other data may be used to improve the accuracy of the SOH and SOC determinations. For example, one or more of battery rating and vehicle fuel and engine type, mileage and service history may be taken into account. These may fine tune the operation of the algorithm. In particular, additional factors may be taken into account to provide a more accurate reflection of SOH, which may depend on factors such as temperature, capacity and the depth of discharge during cranking.

The way in which temperature data may be taken into account will now be described. This data may be used in refining estimates of SOH, SOC and hence SPF, and also in determining the action to be taken by the user as illustrated in FIG. 4.

The server receives a feed of data indicative of the position of the vehicle with respect to time. This may be GPS data or any other suitable data received from a positioning system of the vehicle. The position data may or may not be supplied by the TCU device. When determining the SOH of the vehicle, the server obtains weather data indicative of the temperature expected at the applicable time at the position of the vehicle. This may be obtained from any suitable weather service e.g. from another server. The temperature obtained according to the weather forecast may then be adjusted based upon readings obtained from temperature sensors associated with the vehicle. These may include an oil temperature, water temperature, and temperature within the TCU housing where the TCU includes a temperature sensor. This may help to compensate for any difference between the temperature of the environment surrounding the vehicle, and the actual temperature of the vehicle e.g. due to the precise position of the vehicle, such as in a garage, and the thermal inertia of the vehicle hood. Other weather data may also be obtained and used to try to achieve a more accurate value for the e.g. battery parameters e.g. air pressure, sun coverage. The air pressure may affect oxygen density. A lower oxygen density is associated with lower combustion energy. Engine usage data may also be used in helping to adjust a temperature obtained based on weather data. For example, the server may be arranged to store trip history data. If the vehicle has recently been driven, e.g. if the preceding driving cycle was not long ago, the vehicle battery may be expected to still be at an elevated temperature in comparison to the case in which the vehicle had been parked e.g. for 24 hours.

It will be appreciated that data is accessed from multiple sources in order to implement embodiments of the invention e.g. vehicle TCU, vehicle GPS unit, weather service. The data obtained from different sources may be analysed to compare timestamps, and GPS coordinates as appropriate to correlate the data.

Figure 7:
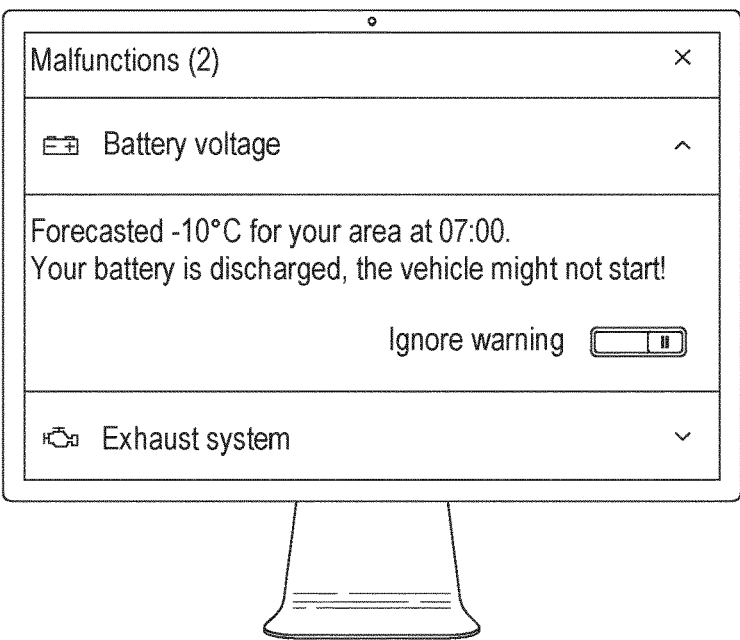
FIG. 7 illustrates an example of information which may be output to a user using a desktop device.
Figure 8:
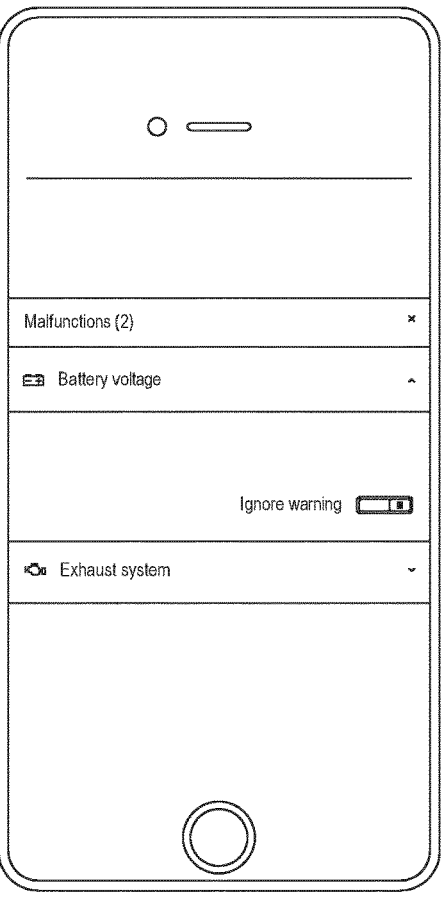
FIG. 8 illustrates another example of a display for a user in relation to a mobile device.

FIG. 7 illustrates an example of information which may be output to a user in the form of a start-up failure warning e.g. as in step 22 or 30 of FIG. 4. This may be provided to the user where the user accesses an app to provide real-time battery information, or where the user has requested an alert in the case of possible startup failure or in the event of cold weather conditions etc. FIG. 7 shows the information as it may be output via a desktop type device. As shown on FIG. 8, the information may equally be provided via a mobile device.

Parasitic loads refer to devices which are using electricity when the car is not running and the doors are locked. Such devices might include mis-grounded light bulbs, lights mistakenly left on, or a device connected to the lighter socket of the car. The present invention provides the ability to detect such loads and alert the user to take action before the battery is drained to too great an extent.

Some more detailed examples of the way in which SOH and SOC for a battery may be defined will now be described. A generic formula for the SOH may be defined as follows:

$$SOH=1-f(N,age,SOC_{average},temp_{average})$$

The SOH is dependent on the age of the battery (age), the number of starting cycles it has provided (N), the average SOC ($SOC_{average}$) and the average temperature ($temp_{average}$). The number of cycles can also vary, depending on the battery type or percentage of the capacity required for start-up. For simplicity a factor $K_n$ will quantify all of these factors and will result in a smaller or higher N.

$$N = K_n \times n_{rated}, \text{ where } K_n = \begin{cases} 1, \text{ for } wetcell \\ 0.7, \text{ for } AGM \end{cases}$$

For convenience, the age of the battery can be considered a linear factor, whereas for the average SOC and temperature, an analogous rationale to the number of cycles is applicable. The decay rate of the battery is proportional to the environment temperature and inversely proportional to the SOC. However, for the purposes of the present invention, these constants will be set to one and furthermore, the SOH will be oversimplified to the following formula.

$$SOH=1-f(N,age)$$

The SOC is defined as a function of the simple moving average of the last 10 driving cycles duration, the ignition ON/OFF time ratio delimited by these cycles and the difference between the first two minimum voltage peaks during the cranking process. The ignition "ON" time corresponds to time spent in the accessories activated, cranking and drive modes of the vehicle i.e. the time other than in an ignition off mode.

$$soc = f(\overline{cycles}, ON/locked_{average}, \Delta voltage)\overline{cycles} = \frac{1}{10}\sum_{i=1}^{10}cycle_i$$

The SOC can be further calibrated based on the steady state OCV when this is achieved.

$$SOC=f(\overline{cycles},ON/locked_{average},OCV,\Delta Voltage)$$

To enhance the SOC calculation, the difference between the first two minimum peaks during cranking are compared. As can be observed in FIG. 9, which illustrates the startup voltage for different SOCs, the second minimum peak is significantly lower when the battery is drained i.e. when SOC is low than when the SOC is high.

When determining any parameter which is an average over a number of cycles, e.g. average duration of cycle, or interval between cycles, the average may be determined as a rolling average over a predetermined number of cycles e.g. 10 cycles. This may help to reduce the amount of data to be processed. Thus, older data need not necessarily be stored.

A flat or faulty car battery is one of the most commonly encountered reasons for vehicle downtime, year-round. Because of this, the electromotor is not able to start-up the combustion engine of the car, especially in cold climates. The cause of this malfunction can range from manufacturing defects, physical damage, electrical loads, faulty alternator and more. Moreover, the number of electronics embedded in modern cars have increased significantly and this trend will continue, stressing a higher load on the car's electrical system. Therefore, considering the telematics technology evolution, as well as the decrease in their price and the need of diminishing the vehicle's downtime, a system that is able to continuously estimate the battery state of health (SOH) is desirable. As a result, a user, whether a vehicle owner, or a fleet manager may have a better insight into the technical status of the vehicles. As the information may become available at a telematics service platform, this information can be used to plan for maintenance more efficiently, ensuring the replacement of the battery in time.

The invention claimed is:

1. A method of obtaining information in relation to the state of a vehicle battery for provision to a user, wherein the battery is used to power cranking of an engine of the vehicle, the method comprising:

receiving a feed of data indicative of a voltage of the vehicle battery with respect to time from a telematics control unit (TCU) of the vehicle at a plurality of different times during each one of a plurality of driving cycles of the vehicle, wherein a driving cycle is defined between initiation of engine cranking, and stopping of the vehicle with the ignition off;

detecting an ignition state of the vehicle;

sampling the voltage at a first rate when the ignition state of the vehicle is detected to be an ignition off state;

sampling the voltage at a second, higher, rate when the ignition state of the vehicle is detected to be an ignition on state;

obtaining data indicative of a timing of each one of the plurality of driving cycles of the vehicle from the detected ignition state of the vehicle;

calculating a set of driving cycle related parameters using at least a portion of the data indicative of the timing of the plurality of driving cycles of the vehicle, wherein the calculated set of driving cycle parameters includes an average duration of a driving cycle and/or an average interval between driving cycles;

calculating a set of one or more voltage related parameters using at least a portion of the data indicative of the voltage of the battery at a plurality of different times during each one of the driving cycles;

calculating a state of charge (SOC) of the battery based at least on the calculated average duration of a driving cycle and the average interval between driving cycles;

calculating a state of health (SOH) of the battery based on a number of driving cycles the battery has undergone and/or an age of the battery;

calculating, for one or more times, a starting probability factor for the battery indicative of a likelihood that the battery will be capable of starting the engine of the vehicle at an applicable time, wherein the starting probability factor is based on the applicable SOC and SOH of the battery; and using the starting probability factor or factors calculated for at least a portion of the one or more times to generate information based on the starting probability factor of the battery for the applicable time for output to a user.

2. The method of claim 1, wherein the data indicative of the timing of one or more driving cycles of the vehicle is obtained based on the at least a portion of the obtained data indicative of the voltage of the battery at a plurality of different times during each one of the plurality of driving cycles, and obtained data indicative of the timing of one or more transitions of the vehicle between ignition states of the vehicle.

3. The method of claim 2, wherein the data indicative of the timing of the one or more transitions of the vehicle between different ignition states is received from a telematics control unit (TCU) of the vehicle.

4. The method of claim 2, wherein the data indicative of the transition of the vehicle between ignition states is obtained using data indicative of a state of an ignition switch of the vehicle.

5. The method of claim 1, comprising storing the feed of data indicative of the voltage of the battery of the vehicle with respect to time in a database of vehicle battery voltage data.

6. The method of claim 1, further comprising obtaining the feed of data indicative of the voltage of the battery:

at a plurality of different times between driving cycles of the vehicle.

7. The method of claim 1, wherein the ignition on or off state of the vehicle is detected via one or more of:

based upon a transition in the state of an ignition switch of the vehicle; and using a telematics control unit (TCU) of the vehicle.

8. The method of claim 1, wherein the starting probability factor further takes into account temperature, wherein the temperature used in calculating the starting probability factor is determined at least in part using weather data applicable to the time to which the starting probability factor relates, wherein the method comprises using data indicative of the position of the vehicle to select weather data applicable to the position of the vehicle.

9. The method of claim 8, wherein the data indicative of the position of vehicle is received from the vehicle and comprises live positional data.

10. The method of claim 8, further comprising calculating a correction to the temperature at the location of the vehicle as indicated by the weather data for use in calculating the starting probability factor, the method comprising using one or more temperature measurements from one or more temperature sensors associated with the vehicle to determine the correction to the temperature.

11. The method of claim 8, further comprising using engine usage history in calculating a correction to the temperature at the location of the vehicle as indicated by the weather data for use in determining the starting probability factor.

12. The method of claim 1, wherein the one or more voltage related parameters include an open circuit voltage.

13. The method of claim 1, wherein the set of one or more voltage related parameters includes a difference between a first two minima in the voltage after initiation of a cranking mode in a driving cycle, wherein said difference is additionally used in calculating the SOC of the battery.

14. The method of claim 1, wherein the information generated is a warning, advice or prompt to the user selected based on the applicable starting probability factor.

15. A non-transitory computer readable medium having a computer program product embodied thereon and comprising computer readable instructions executable by a processor direct the performance of operations comprising:

receiving a feed of data indicative of the voltage of the battery of the vehicle with respect to time from a telematics control unit (TCU) of the vehicle at a plurality of different times during each one of a plurality of driving cycles of an associated vehicle, wherein a driving cycle is defined between initiation of engine cranking, and stopping of the vehicle with the ignition off;

detecting an ignition state of the vehicle;

sampling the voltage at a first rate when the ignition state of the vehicle is detected to be an ignition off state;

sampling the voltage at a second, higher rate, when the ignition state of the vehicle is detected to be an ignition on state;

obtaining data indicative of a timing of each one of the plurality of driving cycles of the vehicle from the detected ignition state of the vehicle;

calculating a set of driving cycle related parameters using at least a portion of the data indicative of the timing of the plurality of driving cycles of the vehicle, wherein the calculated set of driving cycle parameters includes an average duration of a driving cycle and/or an average interval between driving cycles;

calculating a set of one or more voltage related parameters using at least a portion of the data indicative of the voltage of the battery at a plurality of different times during each one of the driving cycles;

calculating a state of charge (SOC) of the battery based at least on the calculated average duration of a driving cycle and/or the average interval between driving cycles;

calculating a state of health (SOH) of the battery based on a number of driving cycles the battery has undergone and/or an age of the battery;

calculating, for one or more times, a starting probability factor for the battery indicative of a likelihood that the battery will be capable of starting the engine of the vehicle at an applicable time, wherein the starting probability factor is based on the applicable SOC and SOH of the battery; and using the starting probability factor or factors calculated for at least a portion of the one or more times to generate information based on the starting probability factor of the battery for the applicable time for output to a user.

16. A system comprising a server device configured to calculate information in relation to the state of a vehicle battery for provision to a user, wherein the battery is used to power cranking of an engine of the vehicle, the server device configured to:

receive a feed of data indicative of the voltage of the battery of the vehicle with respect to time from a telematics control unit (TCU) of the vehicle at a plurality of different times during each one of a plurality of driving cycles of an associated vehicle, wherein a driving cycle is defined between initiation of engine cranking, and stopping of the vehicle with the ignition off;

instruct detection of an ignition state of the vehicle;

instruct sampling of the voltage at a first rate when the ignition state of the vehicle is detected to be an ignition off state;

instruct sampling of the voltage at a second, higher rate, when the ignition state of the vehicle is detected to be an ignition on state;

obtain data indicative of a timing of each one of the plurality of driving cycles of the vehicle from the detected ignition state of the vehicle;

calculate a set of driving cycle related parameters using at least a portion of the data indicative of the timing of the plurality of driving cycles of the vehicle, wherein the calculated set of driving cycle parameters includes an average duration of a driving cycle and/or an average interval between driving cycles;

calculate a set of one or more voltage related parameters using at least a portion of the data indicative of the voltage of the battery at a plurality of different times during each one of the driving cycles;

calculate a state of charge (SOC) of the battery based on the calculated average duration of a driving cycle and/or the average interval between driving cycles;

calculate a state of health (SOH) of the battery based on a number of driving cycles the battery has undergone and/or an age of the battery;

calculate, for one or more times, a starting probability factor for the battery indicative of a likelihood that the battery will be capable of starting the engine of the vehicle at an applicable time, wherein the starting probability factor is based on the applicable SOC and SOH of the battery; and use the starting probability factor or factors calculated for at least a portion of the one or more times to generate information based on the starting probability factor of the battery for the applicable time for output to a user; and the system further comprising a positioning system of the vehicle configured to provide data indicative of a position of the vehicle to the server device, the server device further configured to determine the temperature expected at a position of the vehicle at the applicable time, using the data indicative of a position of the vehicle to select weather data applicable to the position of the vehicle.

\* \* \* \* \*